United States Patent [19]

Kobayashi et al.

[11] Patent Number: 4,606,802
[45] Date of Patent: Aug. 19, 1986

[54] PLANAR MAGNETRON SPUTTERING WITH MODIFIED FIELD CONFIGURATION

[75] Inventors: Shigeru Kobayashi, Tokyo; Katsuo Abe, Yokosuka; Masao Sakata, Yokohama; Osamu Kasahara, Kokubunji; Hidetsugu Ogishi, Hachioji, all of Japan

[73] Assignee: Hitachi, Ltd., Tokyo, Japan

[21] Appl. No.: 682,998

[22] Filed: Dec. 18, 1984

[30] Foreign Application Priority Data

Dec. 21, 1983 [JP] Japan .................................. 58-239884
Dec. 26, 1983 [JP] Japan .................................. 58-243843
Dec. 26, 1983 [JP] Japan .................................. 58-243844

[51] Int. Cl.$^4$ ............................................. C23C 15/00
[52] U.S. Cl. .................................. 204/192 R; 204/298
[58] Field of Search ............................ 204/192 R, 298

[56] References Cited

U.S. PATENT DOCUMENTS

| 4,401,539 | 8/1983 | Abe ................................. 204/192 R |
| 4,404,077 | 9/1983 | Fournier .......................... 204/192 R |
| 4,431,505 | 2/1984 | Morrison, Jr. .................. 204/192 R |
| 4,444,635 | 4/1984 | Kobayashi ....................... 204/192 R |

Primary Examiner—T. M. Tufariello
Attorney, Agent, or Firm—Antonelli, Terry & Wands

[57] ABSTRACT

Planar magnetron sputtering sputters a target formed of plural target members from their principal surface. The plural target members are arranged on an electrode. The sputtering is carried out in such a condition that an electric field and magnetic field are substantially parallel in their direction at the boundary regions among the plural target members.

33 Claims, 16 Drawing Figures

PLANAR MAGNETRON SPUTTERING WITH MODIFIED FIELD CONFIGURATION

This invention relates to planar magnetron sputtering for depositing a thin film, and more particularly to planar magnetron sputtering for depositing an alloy film with high purity and few extraneous matters at high speed.

Sputtering, particularly planar magnetron sputtering, has been explained in many articles and so the explanation herein may be omitted.

The deposition of a film of refractory metal silicide is usually carried out by so-called cosputtering. More specifically, respective electrodes for refractory metal and silicon are placed in the same chamber, and the refractory metal and silicon are evaporated (sputtered) therefrom to deposit a mixed film consisting of the refractory metal and silicon onto a wafer (substrate) mounted on a rotatory jig. Refractory metal and silicon are deliberately sputtered from their respective electrodes, because the alloy consisting of refractory metal and silicon has such a high melting point (usually above 2000° C.) that it is difficult to purify refractory metal silicide alloy and to obtain source alloy having a sufficiently high purity. In the cosputtering mentioned above, the wafer is mounted on the planetary evaporation jig which relates about its axis and revolves about a locus center in order to provide a uniform composition ratio between the refractory metal and silicon. A large number of wafers are mounted on the planetary jig or jigs. Such cosputtering has few problems with respect to productivity because of the batch processing of a number of wafers, but has such a disadvantage that the deposition rate for each wafer is low and hence a high quality film is hard to be produced due to the affects of residual gas in the deposition process. Generally, the mixed film of refractory metal and silicon coated by sputtering is subsequently annealed to allow alloying. The alloyed film has a greatly reduced resistivity compared with that of the as-deposited film. Those films deposited at low deposition rates, however, exhibit still higher resistivities after annealing compared with the resistivity of films deposited at high deposition rates.

In order to obviate the disadvantage of the conventionally employed cosputtering of the above kind, the present inventors and their colleagues have developed and proposed a novel method of depositing alloy films, which can provide deposition rates ten times or more as fast as the conventional rates (e.g. U.S. Pat. Nos. 4,401,539 and 4,444,635). This sputtering employs a planar magnetron electrode having magnetic field generating means using electromagnet coils 104, 105 concentrically and doubly wound as shown in FIG. 1, and a sputtering target structure 201 in which there are placed in concentric and multiannular shape, a refractory metal target member 203 and silicon target members 202, 204 in multi-annular shape, as shown in the section of FIG. 1 and plan of FIG. 2.

The operation of the above sputtering electrode of dual magnetic pole structure is disclosed in detail in the report by the present inventors (Thin Solid Films 96 (1982) 225–233), and only a brief summary thereof will be described hereinbelow. This sputtering electrode permits the diameter of the generated annular glow discharge (plasma) to be altered arbitrarily by adjusting the current flowing through two electromagnets. First, the diameter of the annular plasma is made large, and thereby the exterior silicon target member 202 is sputtered. Then, the diameter of the annular plasma is reduced to sputter the intermediate refractory metal target member 203. Then, the diameter of the plasma is further reduced to sputter the innermost or central circular silicon target member 204. Next, the diameter of the plasma is enlarged successively to sputter the intermediate refractory metal target member 203 and exterior silicon target member 202 sequentially. Letting the above steps of operation as one cycle, several cycles to several tens of cycles of sputtering are repeated to deposit a mixed film of refractory metal and silicon on the wafers. The manner of changing the annular plasma diameter is selected to control the thickness distribution and the composition distribution in the film deposited on the wafer 110 to be kept in predetermined ranges.

Figure 1:
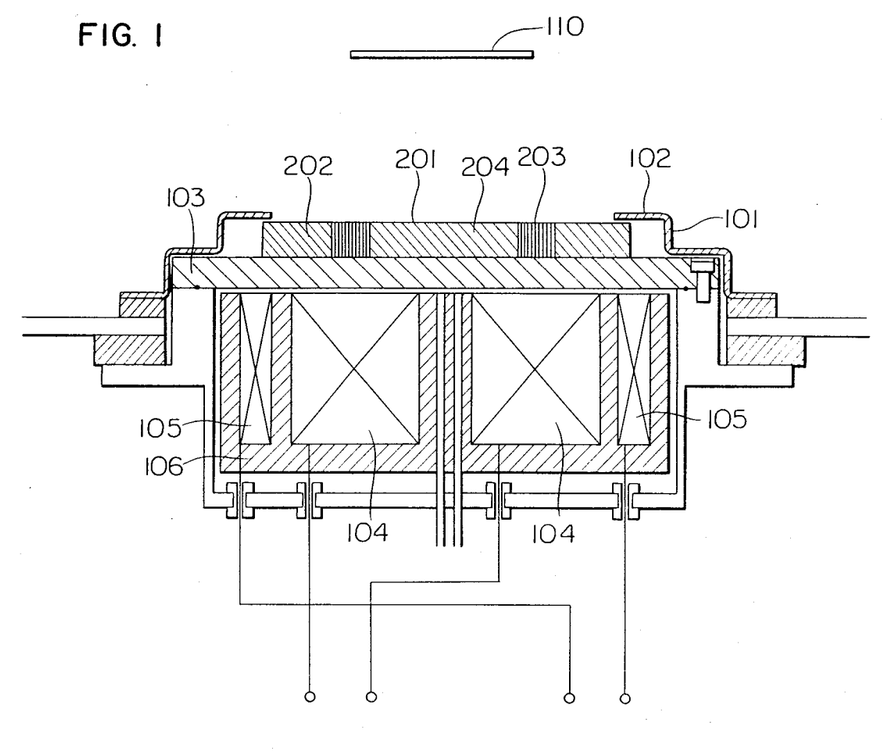
FIG. 1 is a sectional view which shows the conventional planar magnetron sputtering electrode structure having a sputtering target structure with a flat sputtering surface and multi-annular shape.
Figure 2:
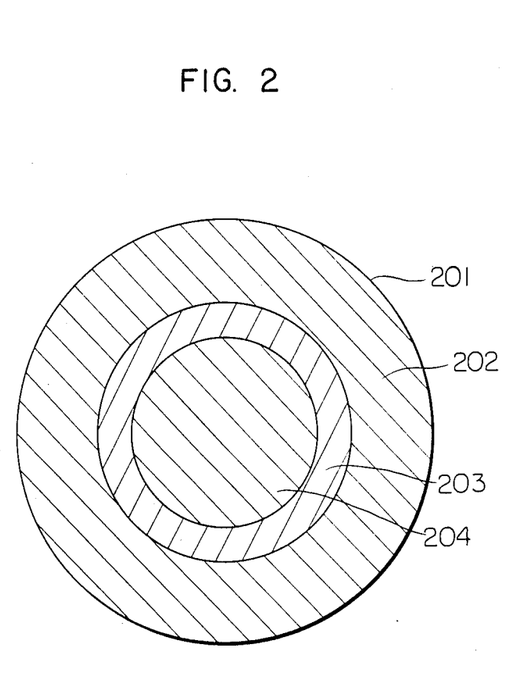
FIG. 2 is a top plan view of the sputtering target as shown in FIG. 1.
Figure 3:
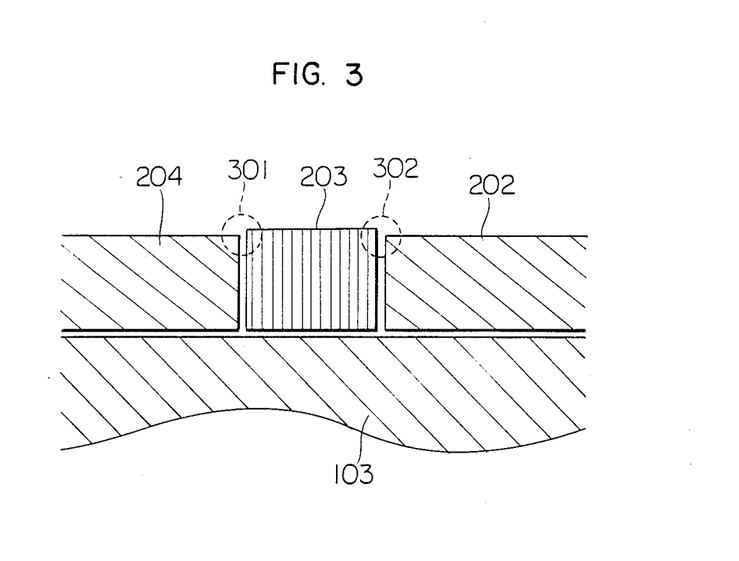
FIG. 3 is a typical sectional view of the boundary regions among the target members of the sputtering target.

The target structure as shown in FIGS. 1 and 2, however, is accompanied with problems, mainly the following two problems. First, when sputtering is carried out, the temperature of the target member arises and cracks can be generated in the exterior annular silicon target member 202 due to the difference in the thermal expansion coefficient between respective targets, etc. According to the experiments performed by the inventors, the upper limit of sputtering power without causing any problem was about 1000 W, at which condition, and average deposition rate of 1000 Å/min. was obtained. Greater deposition rates, however, are desirable for further improving the productivity of sputtering. Secondly, the sputtering also occurs at the boundaries among the target members of different materials. The boundaries are schematically shown in FIG. 3 in enlarged section. The careful observation of this section will teach that there are small steps 301, 302 on both sides of the annular refractory metal target member 203, which are attributed to the differences between each target member in the thickness and taper shape. The presence of the annular plasma on the refractory metal target permits not only the refractory metal target but also the silicon target surrounding it to be sputtered because of the outer tailing of the plasma to some degree. Then, the concentration of electric field occurs at the small steps 301, 302 as shown in FIG. 3, and abnormal glow discharge will occasionally occur. The abnormal discharge during the sputtering is considered to be a small arc discharge, for example. This abnormal discharge, i.e. local excess discharge, may deposit a part of the target material on the wafer as lumps each having a diameter of 0.1–100 μm. This lump is called a splash or splatter. The wafer deposited with such an extraneous matter is a defective product.

The step structure as shown in FIG. 3 may be exaggerated as the target material is consumed with the progress of sputtering. Thus, the above fact is one of serious problems. In the example using the target as shown in FIGS. 1–3, there usually occur 50–200 extraneous matters, which may be ascribed to the above abnormal discharge, on a wafer where the refractory metal silicide film of 3000 Å thick is deposited on the wafer with a diameter of 100 mm. Thus, it has been considered to be difficult to implement the above method using the target structure as shown in FIGS. 1 and 2 in practical production.

An object of this invention is to provide a method of planar magnetron sputtering which is capable of obviating the disadvantage involved in the conventional technique, and of depositing a thin film, particularly a thin alloy film, with few extraneous matters deposited on an object wafer due to abnormal glow discharge, by sputtering at high speed, and an apparatus for implementing the method.

In order to attain the above object, in accordance with this invention, there is provided a sputtering electrode structure in which a plurality of target members are provided with the boundary regions therebetween where the direction of the magnetic field for confining discharge space and the direction of the electric field above the principal surface of the target do not cross at about a right angle to each other, thereby to reduce or stop the occurrence of sputtering at the boundary regions and thereby suppress or prevent the occurrence of abnormal glow discharge at the boundary regions during sputtering. Hereinafter, this invention and the principles thereof will be explained.

Figure 4:
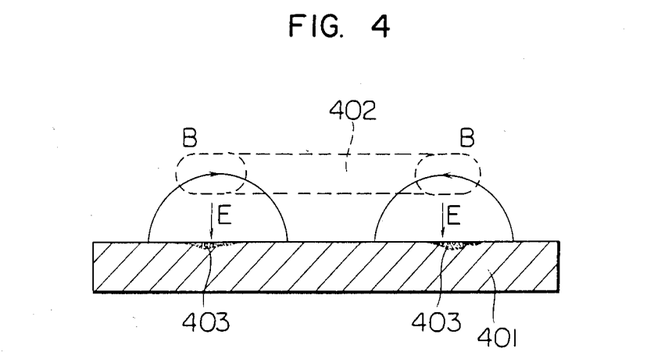
FIG. 4 is a concept representation of a magnetron sputtering, for explaining the positions of occurrence of plasma rings.
Figure 5:
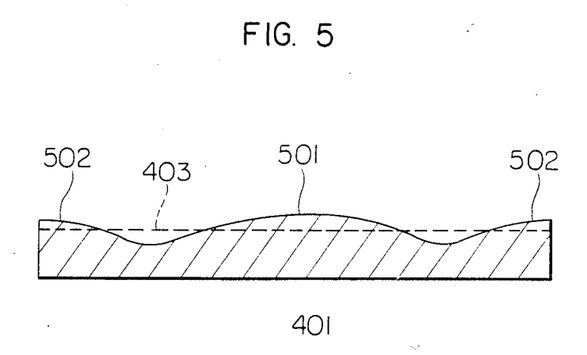
FIG. 5 is a sectional view of the target, for showing the consumption regions of the target member by sputtering in FIG. 4.

FIG. 4 is a schematic representation for explaining the magnetic field distribution above a target plate 401 and the places where the target plate is consumed, when employing an ordinary planar magnetron sputtering electrode. As is well known, an intense discharge, called "magnetron discharge", occurs at the places where a magnetic field vector $|B$ is parallel to the plane of the target plate to be subjected to sputtering. The discharge glow becomes annular as shown in FIG. 4. The target material immediately below the thus formed annular plasma 402 is sputtered. The annular regions in the target plate are commonly called consumption regions (or erosion regions) 403. The target material is consumed at the consumption regions, while a part of sputtered particles are deposited at the central portion 501 of the target plate or at the exterior portions 502 of the annular erosion regions. Incidentally, the broken lines illustrate the contour of the target plate before the sputtering is performed.

As mentioned above, sputtering occurs in the regions where the magnetic field vector is parallel to the surface of the target plate. This is because an electric field vector $|E$ is incident vertically to the target plate. Therefore, an intense discharge occurs in the regions where the magnetic field vector $|B$ and electric field vector $|E$ perpendicularly intersect each other.

Figure 6:
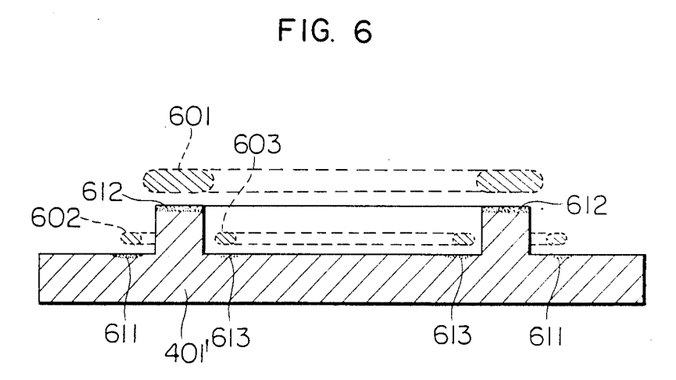
FIG. 6 is a concept representation which shows the sputtering target structure for explaining the theory of this invention and the consumption regions by sputtering.

FIG. 6 shows the manner of discharge when a target plate 401' does not have a completely flat plane but an annular stepwise convex portion. The experiment by the inventors has confirmed that the annular plasma as shown in FIG. 4 is now separated into three plasma rings 601, 602 and 603 in this case. Although the clear separation of the annular plasma cannot be observed with the naked eye, the fact is confirmed as follows. The presence of three annular plasmas can be confirmed by the observed three consumption regions 611, 612 and 613 and deposits of the target material 401' on both sides of the convex portion as shown in FIG. 7, which shows the main part of FIG. 6.

The reason why triple annular erosion region are formed as mentioned above can be considered as follows.

First, consideration is made on the electric field distribution above the target plate 401 provided with a convex portion. In FIG. 7, broken lines designate electric field vectors $|E$ while solid lines designate magnetic field vectors $|B$. When the target material is electrically conductive as in the case of metal, an electric line of force is incident perpendicularly to the surface of the target material. Thus, such a electric field distribution as shown in FIG. 7 by the broken lines is formed.

Figure 7:
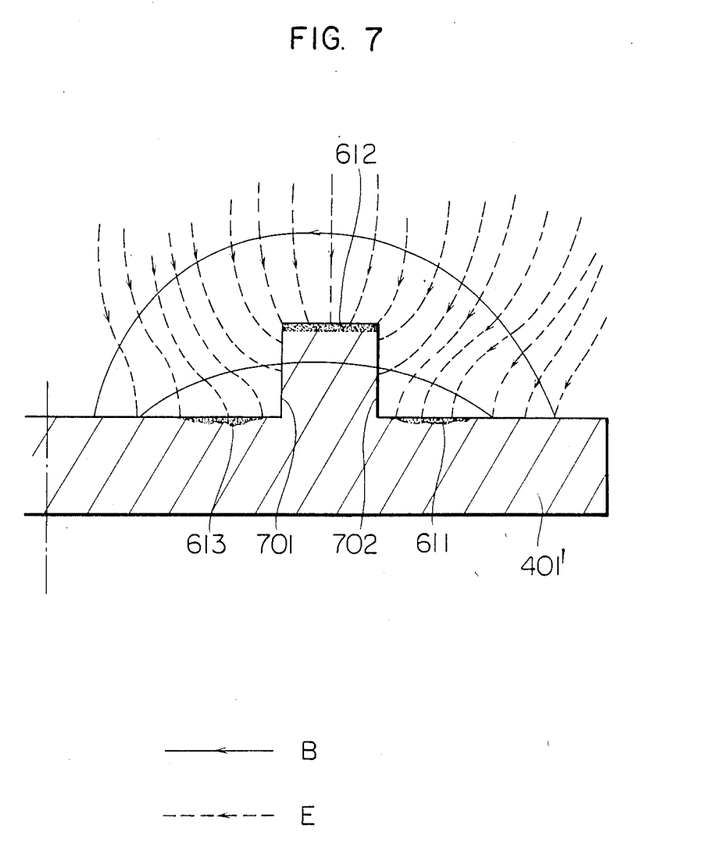
FIG. 7 is a concept representation of the distribution of the electric field and magnetic field in FIG. 6.

On the other hand, the magnetic field vector $|B$ exhibits such a distribution as shown in FIG. 7 by the solid lines, as in FIG. 4 provided that the target material is not a magnetic material. It will be seen from the figure that the magnetic field vectors $|B$ intersect substantially perpendicularly the electric field vectors $|E$ on each of the consumption regions 611, 612 and 613 thereby to provide the consumption regions. On the other hand, on both sides 701, 702 of the convex portion, the electric field vectors $|E$ and the magnetic field vectors $|B$ are substantially parallel to each other, and so it is considered that an intense discharge will not occur there. Thus, the above mentioned observation result in the experiment by the inventors with respect to the consumption regions can be elucidated. In case the discharge occurs, more complicated electric field distribution may result. The observation result, nevertheless, can be elucidated qualitatively. Incidentally, the consumption speed at the convex consumption region 612 is about five times as fast as that at the other consumption regions.

Accordingly, the feature of this invention resides in that in order to suppress or prevent the occurrence of abnormal discharge at the boundary regions among plural target members during sputtering, the respective directions of the magnetic field and electric field on these boundary regions are made substantially parallel to each other to attenuate or stop the occurrence of the sputtering there. The specific feature of this invention resides in that the height of the to-be-sputtered principal surface of the plural target members is alternately varied to make the respective directions of the electric and magnetic fields substantially parallel to each other at the boundary regions.

The further feature of this invention resides in the new structure of a sputtering target, which is material for deposition of a thin film by sputtering, and which permits the thin film with high purity and few extraneous matters, to be deposited through sputtering.

The still further feature of this invention is a new sputtering method which performs the sputtering with the sputtering target in contact with a backing plate at plural points for achieving good electric connection and good thermal conduction therebetween, whereby sputtering of materials of a high resistivity such as silicon can be carried out at high electric power.

The present invention will be apparent from the following detailed description taken in conjunction with the accompanying drawings, in which.

Figure 8:
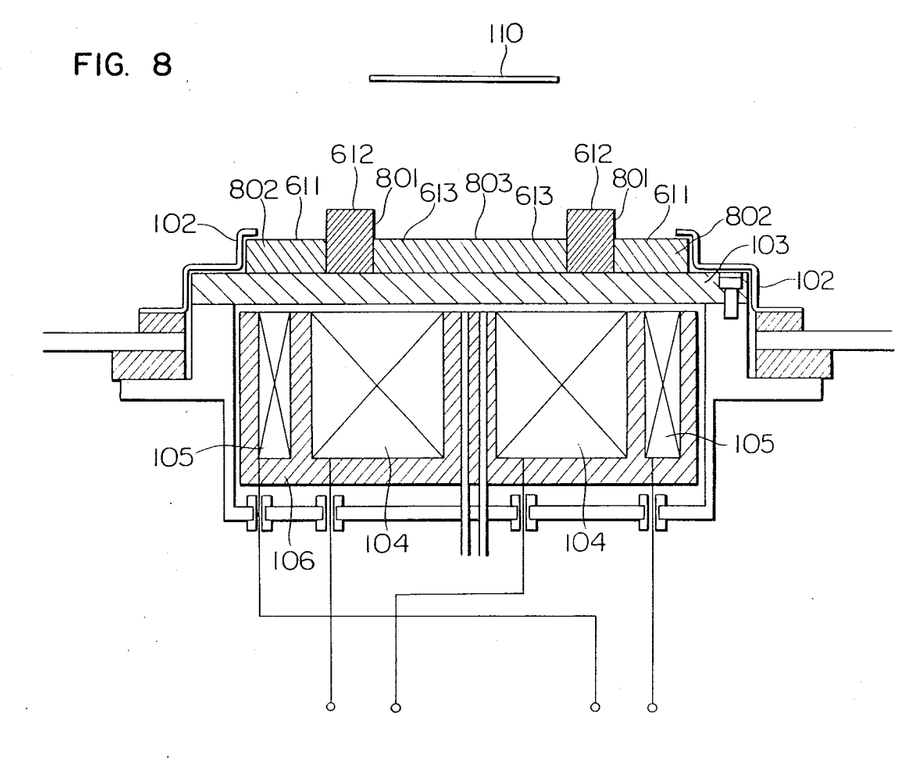
FIG. 8 is a sectional view of a planar magnetron sputtering electrode structure according to one embodiment of this invention.

Now, explanation will be made on the embodiments of this invention referring to the drawings. FIG. 8 shows the section of the magnetron sputtering electrode structure according to one embodiment of this invention. A sputtering electrode structure is of the above mentioned dual magnetic pole structure with the diameter of a generated annular plasma being variable. In the figure, numeral 801 denotes a molybdenum target member of a ring shape, 802 denotes a silicon target member of a doughnut shape (hereinafter referred to as an exterior silicon target member), and 803 denotes a disk shape of silicon target member (hereinafter referred to as a central silicon target member). These target members are fixed to a backing plate 103 by metal bonding, etc. The molybdenum target member 801 protrudes above the exterior silicon target member 802 and the central silicon target member 803. In the figure, numeral 102 denotes an anode; 104, 105 denote an electromagnet coil; 106 denotes a yoke for magnetic field generation; 110 denotes a substrate on which a thin film is to be deposited; and 611, 612, 613 designate a consumption region of target material, respectively.

Hereafter, the operation and advantage of the embodiment having the above mentioned construction will be described. First, the inventors have confirmed that the diameter of the generated annular plasma is variable also in this embodiment as in the case using a flat target member as shown in FIG. 1. In this embodiment, sputtering is carried out with the diameter of the annular plasma being varied in a suitable cycle to produce a mixed film of molybdenum and silicon with a predetermined uniform composition on the substrate. In this embodiment, sufficient controllability can be achieved with respect to a film thickness distribution property and composition distribution property although some difference therein is inevitable.

Next, checking has been made on the number of extraneous matters deposited on the substrate 110. A silicon wafer having a diameter of 100 mm is employed as the substrate 110. The measurement of the number of the extraneous matters on the wafer is made after the film with the composition ratio, silicon:molybdenum = 2:1 and the film thickness of 3000 Å has been deposited on the wafer. As a result of the measurement, the number of the extraneous matters having a diameter over 1 $\mu$m is on the order of 3-7. On the other hand, as for the case of the sputtering electrode structure as shown in FIG. 1, it is on the order of 50-200. This comparison shows a great improvement in this embodiment. Such a considerable reduction of the number of the extraneous matters is attributable to the sufficient suppression of the occurrence of abnormal glow discharge at the boundary regions between the exterior and the central silicon target members, and the molybdenum target member.

Explanation will be made on the embodiments with respect to a sputtering target referring to the drawings.

Figure 9:
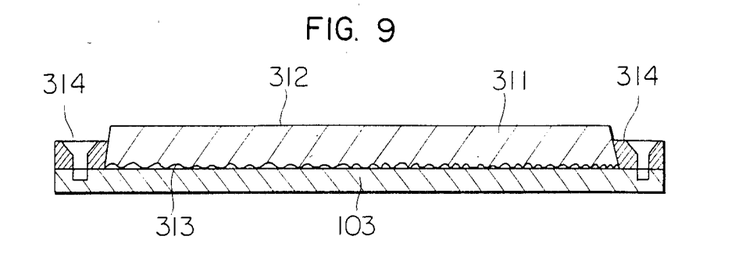
FIG. 9 is a sectional view of a sputtering target with unevenness on its second principal surface.
Figure 10:
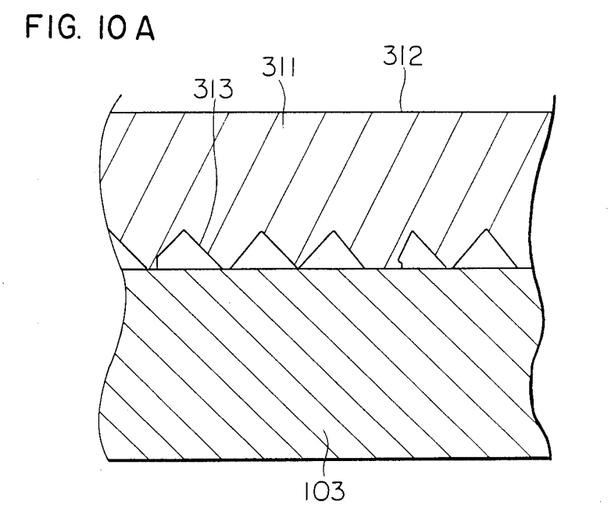
FIGS. 10A and 10B are a detail view of FIG. 9, respectively.

FIG. 9 shows one embodiment of the sputtering target according to this invention, in which a relatively soft material such as aluminum is employed as the target material. As seen from the figure, second principal surface 313 of the sputtering target 311, which is opposite to the first principal surface to be subjected to sputtering, is in contact with a backing plate 103 by means of a holding jig 314. More specifically, the second principal surface 313 of the sputtering target 311 is provided with an unevenness consisting of minute convex and concave portions, the detail of which is shown in FIG. 10A, e.g. by machining, in such a way as to uniformly bring the convex portions into contact with the backing plate 103 over the entire second principal surface 313. With the height of each convex portion being of about 1 mm, the shape thereof being of a triangle, and the pitch of convexness and concaveness being of about 1–5 mm, the more improved uniform contact with the backing plate can be obtained. Since in this embodiment, a relatively soft metal such as aluminum is employed as the target, the convex portions are pressed down and slightly squashed by the holding jig 314 to provide the contact with the backing plate 103 at many points.

FIG. 10B shows the case where the backing plate 103, but not the sputtering target, is provided with the unevenness. Such a structure also provides the same advantage as that of FIG. 10A.

Figure 11A:
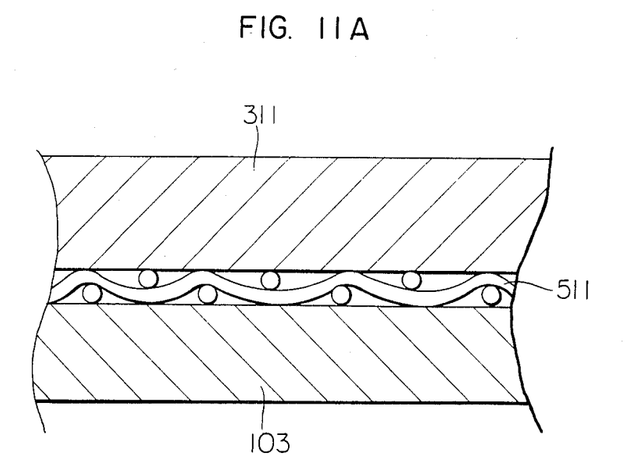
FIGS. 11A and 11B are diagrams showing the other embodiment of FIG. 9, respectively.

FIG. 11A shows a second embodiment of the sputtering target which gives the same effect as the unevenness of the first embodiment. Where the fragile material such as silicon is employed as a sputtering target, it is difficult to perform the unevenness machining of the back surface thereof. In view of this fact, a metallic mesh 511 is located between the backing plate 103 and the sputtering target 311. This metallic mesh 511 implements both good electrical contact and thermal contact therebetween. The mesh with woven copper wires is preferable from the viewpoints of softness and thermal conduction coefficient. The pitch of the mesh may be about 1–6 mm since any significant different result is not given in this range.

Figure 11B:
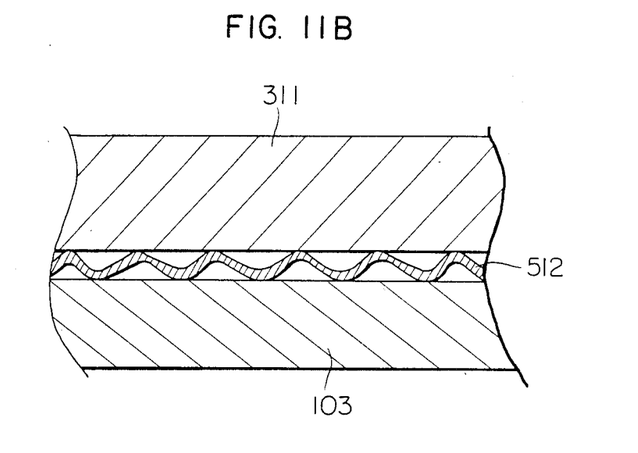

FIG. 11B shows the example of using a foil 512 minutely folded back like a zinc roof, in place of the metallic mesh. Such a structure also provides the same advantage as that of Fig. 11A.

Figure 12:
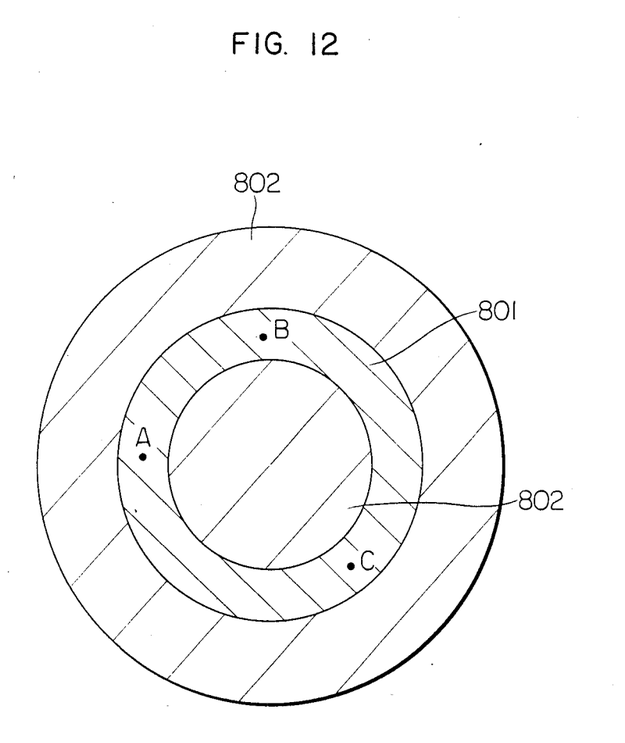
FIG. 12 is a top plan view of the sputtering target when using plural target members in accordance with this invention.
Figure 13:
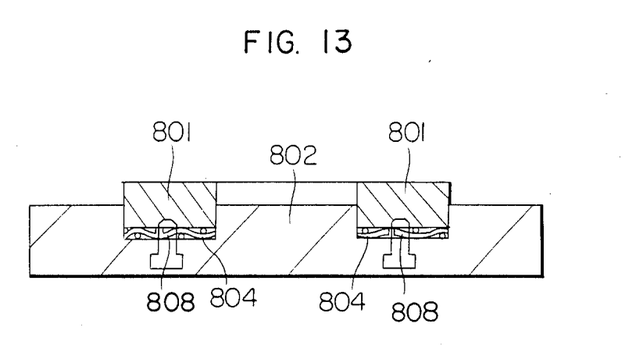
FIG. 13 is a sectional view of FIG. 12.

FIGS. 12 and 13 shows a third embodiment of the sputtering target according to this invention. In order to deposit an alloy thin film by sputtering, the sputtering target is frequently constructed by plural kinds of materials. FIG. 12 shows a disc shape of sputtering target constructed by combining the respective target members of silicon and molybdenum to provide an alloy film consisting of these materials. With respect to this sputtering target, U.S. Pat. Nos. 4,401,539 and 4,444,635 issued to the present inventors may be referred to. In FIG. 12, numeral 802 designates a target member of silicon and 801 disignates a target member of molybdenum. Alternatively, silicon may be embedded in a molybdenum disc. The sectional structure of the sputtering target of FIG. 12 is shown in FIG. 13.

The sputtering target, as shown in FIG. 13, consists of an annular target member 801 of silicon and a disk shape of target member 802 of molybdenum, having a groove, into which the target member 801 is embedded, in the first principal surface of the sputtering target.

The most serious problem to be solved in such a sputtering target structure is an electrical contact between the molybdenum target member 802 and the silicon target member 801. Silicon, even when it is doped with impurities, has a higher resistivity than pure metal as a natural consequence of semiconductor material. For example, where the disc target member 802 and the annular target member 801 are in contact with each other at only three points A, B and C in FIG. 12, the annular target member in the neighborhood of the points A, B and C is subjected to more intense sputtering since silicon is highly resistive, with the result that undesired thermal concentration and nonuniform consumption of target material occur. If the annular target member is aluminum, the unevenness of sputtering will not be very large since aluminum has a very low resistivity, apart from a thermal problem.

The above inconvenience can be obviated by a metallic mesh 804 located between the annular target member 801 and the disc target member 802, as shown in FIG. 13, and thus a good electrical contact therebetween can be maintained.

A molybdenum silicide film was formed by using the sputtering target as shown in FIGS. 12 and 13. According to the inventors' experiments, the compositional ratio of molybdenum to silicon in the film deposited on the substrate greatly varied in each deposition when the metallic mesh 804 was not employed. This can be considered to be due to such a phenomenon that the silicon target member 801 swells during sputtering thereby to alter the contacts with the molybdenum target member 802 in their position and number in each sputtering process. The metallic mesh 804 as shown in FIG. 13 provided very good reproducibility of the sputtering process. This metallic mesh 804 also prevented the silicon target member 801 from being cracked even when the sputtering is carried out by using high electric power. When this metallic mesh was not employed, the annular silicon target member 801 might crack for the sputtering power over about 600 W, and could no longer be used. By the use of this metallic mesh 804, the annular silicon target member did not crack or was not damaged even for the sputtering power of 1.6 kW. This is attributable to the improved thermal contact between the silicon target member 801 and the molybdenum target member 802.

Figure 14:
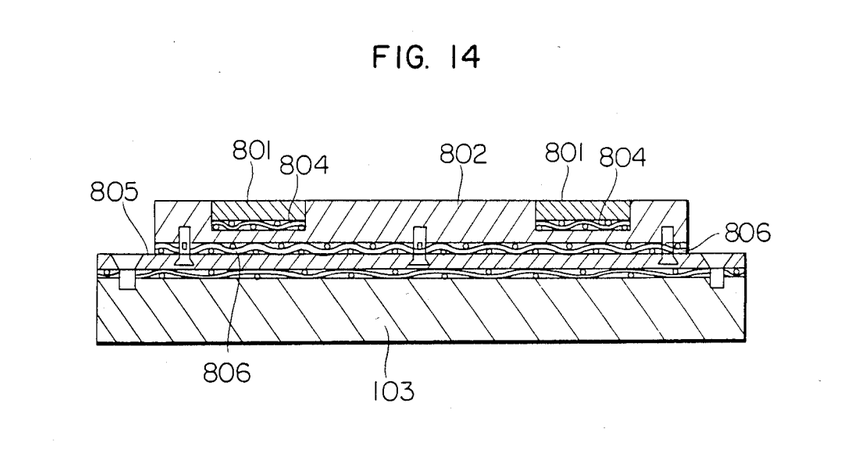
FIG. 14 is a diagram showing another embodiment in which an auxiliary backing plate is employed in accordance with this invention.

The sputtering target structure constructed in the manner as mentioned above is fixed to the backing plate 103 by means of a screw or screws, etc. This fixing can be made by the conventional technique, e.g. bonding, although it has some defects, and also in such a way to assemble the sputtering target structure on an auxiliary backing plate 805 and to fix the thus formed assembly to the backing plate 103 by means of another metallic mesh 806 which is identical to the mesh 804 as mentioned above.

As described above, the gist of the sputtering target according to this invention resides in that many point contacts are uniformly established between a target and a backing plate, between respective target members which constitute a target or between the backing plate and an auxiliary backing plate over the entire contact area therebetween, in order to establish good electrical and thermal contact therebetween.

The above mentioned many-point-contacts may be made by providing the film having an unevenness in its surface, on at least one of the planes in contact to each other by machining, etching or any means. The methods by these means is included in the technical concept of this invention.

Thus, the electrical and thermal contacts can be improved between the sputtering target and the backing plate, between the members constituting the target or between the backing plate and the auxiliary backing plate. Therefore, there are obtained such meritorious effects as the easy replacement of the sputtering target independently of the backing plate, occurrence of uniform plasma during sputtering above the target, high power sputtering (which allows film deposition at higher speed since the maximum input power has improved, e.g. from 600 W to 1.6 kW or more), etc.

As understood from the explanation hereinabove the present invention, when depositing a thin film, particularly a thin alloy film on a substrate using a planar magnetron sputtering, is capable of depositing the film with greatly reduced extraneous matters deposited on the substrate ascribed to abnormal glow discharge, by sputtering at high speed.

We claim:

1. A method of planar magnetron sputtering comprising the step of sputtering a sputtering target comprising a plurality of target members from a principal surface, said plurality of target members arranged side by side on an electrode so as to provide a boundary region between each two of the plurality of target members arranged side by side, with an electric field and magnetic field being made substantially parallel in their direction at each of the boundary regions between each two of said plurality of target members, to thereby reduce the occurrence of sputtering at the boundary regions.

2. A method of planar magnetron sputtering according to claim 1, wherein at least one of said plurality of target members is made of a material different from the other target members.

3. A method of planar magnetron sputtering according to claim 2, wherein at least one of said boundary regions is of an annular shape.

4. A method of planar magnetron sputtering according to claim 3, wherein said boundary regions are concentric with each other.

5. A method of planar magnetron sputtering according to claim 4, wherein a first principal surface of the annular shape of first target member having an interior and exterior concentric boundary regions on its both side is placed on a plane different from either one of a second principal surface of the second target member encircled by said interior boundary region of the first target member and a third principal surface of the third target member adjacent to said exterior region of the first target member.

6. A method of planar magnetron sputtering according to claim 5, wherein said second target member and third target member are made of the same material.

7. A method of planar magnetron sputtering according to claim 1, wherein said plurality of target members are fixed mutually, or to a target support member, through a plurality of contact points.

8. A method of planar magnetron sputtering according to claim 7, wherein said sputtering is performed so as to form a film of the material of the sputtering target on an object, said object being positioned so as to oppose a principal surface of the sputtering target, and wherein the principal surface of the sputtering target has level surface portions, side by side, such that a second level surface portion protrudes above a first level surface portion toward said object, the second level surface portion forming a convex portion relative to said first level surface portion, so as to provide the electric and magnetic fields to be substantially parallel at boundary regions between the first and second level surface portions.

9. A method of planar magnetron sputtering according to claim 8, wherein the target members are non-magnetic.

10. A method of planar magnetron sputtering according to claim 9, wherein said electric field and said magnetic field form a plasma above said sputtering target so as to provide said sputtering, and wherein said plasma is magnetically moved during said sputtering.

11. A method of planar magnetron sputtering according to claim 1, wherein said sputtering is performed so as to form a film of the material of the sputtering target on an object, said object being positioned so as to oppose a principal suirface of the sputtering target, and wherein the principal surface of the sputtering target has level surface portions, side by side, such that a second level surface portion protrudes above a first level surface portion toward said object, the second level surface portion forming a convex portion relative to said first level surface portion, so as to provide the electric and magnetic fields to be substantially parallel at boundary regions between the first and second level surface portions.

12. A method of planar magnetron sputtering according to claim 1, wherein said electric field and said magnetic field form a plasma above said sputtering target so as to provide said sputtering, and wherein said plasma is magnetically moved during said sputtering.

13. An apparatus for planar magnetron sputtering having a planar magentron sputtering electrode structure including a sputtering target structure consisting of a plurality of target members arranged side by side and having a principal surface to be subjected partially or entirely to sputtering, with each adjacent two of said plurality of target members meeting to form a boundary region therebetween, said, target members each being sputtered while magnetically moving a plasma generated above the principal surface corresponding to each target member, wherein a magnetic field for confining discharge and an electric field for accelerating ions do not perpendicularly intersect each other at the boundary regions between adjacent target members on said principal surfaces such that the boundary regions are non-erosion regions of target material by sputtering, whereby occurrence of abnormal discharge at the boundary regions is suppressed.

14. An apparatus for planar magnetron sputtering according to claim 13, wherein the principal surface of at least one of said plurality of target members is placed on a plane different from the principal surfaces of others of the target members, so as to form boundary regions between adjacent target members having principal surfaces in different planes, and the magnetic field for confining discharge and the electric field for accelerating ions do not perpendicularly intersect each other at each of the boundary regions between adjacent target members which has principal surfaces in different planes.

15. An apparatus for planar magnetron sputtering according to claim 13, wherein at least one of said plurality of target members is made of a material different from the other target members.

16. A method of planar magnetron sputtering according to claim 1, wherein said sputtering target is in contact with a cooling member at plural points during sputtering.

17. A method of planar magnetron sputtering according to claim 16, wherein said sputtering target consists of a plurality of target members.

18. A method of planar magnetron sputtering according to claim 16, wherein said cooling member comprising a metal mesh.

19. A method of planar magnetron sputtering according to claim 17, wherein at least one of said plurality of target members is in contact with at least one of the other target members at plural points.

20. An apparatus for planar magnetron sputtering according to claim 13, wherein said magnetic field for confining discharge and said electric field for accelerating ions are parallel to each other at the boundary regions.

21. An apparatus for planar magnetron sputtering according to claim 14, wherein said magnetic field for confining discharge and said electric field for accelerating ions are parallel to each other at the boundary regions between adjacent target members which have principal surfaces in different planes.

22. An apparatus for planar magnetron sputtering according to claim 13, wherein said plurality of target members are fixed mutually, or to a target support member, through a plurality of contact points.

23. An apparatus for planar magnetron sputtering according to claim 22, further comprising means for holding an object, on which object is to be formed a film of the material of the target members by the sputtering, the holding means being positioned so as to hold the object opposed to a principal surface of the plurality of target members; and wherein the principal surface has level surface portions, side by side, such that a second level surface portion protrudes above a first level surface portion toward the object, the second level surface portion forming a convex portion relative to said first level surface portion, so as to enable magnetic and electric fields that are not perpendicular to each other to be formed at boundary regions between the first and second level surface portions.

24. A target structure for forming films by sputtering said target structure, said target structure comprising a plurality of target members and facing an object on which a film is to be formed, and wherein:

a first target member is formed of a first conductive material and has a first level surface;

a second target member is formed of a second conductive material and has a second level surface;

said first and second target members being disposed side by side in such manner that said second level surface protrudes above said first level surface toward said object and forms a convex portion relative to said first level surface; and said plurality of target members are fixed mutually, or to a target support member, through a plurality of contact points.

25. A target structure according to claim 24, wherein said first conductive material is silicon and said second conductive material is molybdenum.

26. A target structure according to claim 24, wherein said first conductive material is molybdenum and said second conductive material is silicon.

27. A target structure according to claim 24,
wherein said first and second target members are fixed to the target support member, which target support member is a backing plate formed of a metal adapted to be connected to a cathode for supporting said first and second target members and establishing an equipotential surface at its surface; and
further comprising electromagnet means disposed below said backing plate for generating a variable magnetic field above said target members.

28. A target structure according to claim 27, further comprising interconnection member formed of a soft metal of good electrical and thermal conductivity disposed at least at one of interconnections among said first target member, said second target member and said backing plate.

29. A target structure according to claim 24, wherein said plurality of contact points is generated by providing unevenness on said plurality of target members or in said target support member and by compressing said members.

30. A target structure according to claim 24, wherein said plurality of contact points is constituted by metallic means interposed between the members.

31. A target structure according to claim 30, wherein said metallic means is metal mesh.

32. A target structure according to claim 30, wherein said metallic means is a folded metal foil.

33. A target structure according to claim 30, wherein said metallic means is made of copper.

* * * * *